United States Patent
Deb et al.

(10) Patent No.: US 7,340,956 B2
(45) Date of Patent: Mar. 11, 2008

(54) BUILT-IN SELF TEST OF MEMS

(75) Inventors: Nilmoni Deb, Pittsburgh, PA (US); Ronald D. Shawn Blanton, Sewickley, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 11/370,818

(22) Filed: Mar. 8, 2006

(65) Prior Publication Data
US 2006/0150709 A1 Jul. 13, 2006

Related U.S. Application Data

(62) Division of application No. 10/666,147, filed on Sep. 18, 2003, now Pat. No. 7,152,474.

(60) Provisional application No. 60/411,703, filed on Sep. 18, 2002.

(51) Int. Cl.
G01P 15/125 (2006.01)
G01P 21/00 (2006.01)

(52) U.S. Cl. ................. 73/514.32; 73/504.14

(58) Field of Classification Search ........ 73/1.37–1.38, 73/504.04, 504.12, 504.13, 504.14, 504.15, 73/504.16, 514.32, 514.36, 514.38; 702/92–96, 702/56, 151, 153, 141, 196
See application file for complete search history.

(56) References Cited

U.S. PATENT DOCUMENTS

| | | | |
|---|---|---|---|
| 6,232,790 B1 | 5/2001 | Bryan et al. | |
| 6,718,823 B2 | 4/2004 | Platt | |
| 6,729,176 B2 * | 5/2004 | Begin | ............... 73/1.38 |
| 6,761,068 B1 | 7/2004 | Schmid | |
| 6,837,108 B2 | 1/2005 | Platt | |

(Continued)

OTHER PUBLICATIONS

A. Kourepenis, J. Borenstein, J. Connelly, R. Elliott, P. Ward, and M. Weinberg, "Performance of MEMS Inertial Sensors," Position Location and Navigation Symposium, pp. 1-8.

(Continued)

Primary Examiner—Helen Kwok
(74) Attorney, Agent, or Firm—Jones Day; Edward L. Pencoske (57) ABSTRACT

The present disclosure is directed to an apparatus and method for producing and comparing signals from various points in a MEMS device. By producing signals which should be of substantial identical characteristics, deviations from the situation where the signals are of identical characteristics can be used to identify various types of asymmetry which are otherwise difficult to detect. In one embodiment, the MEMS device is comprised of a plurality of fixed beams arranged symmetrically and a plurality of movable beams arranged symmetrically. A first sensor is formed by certain of the fixed and movable beams while a second sensor, electrically isolated from said first sensor, is formed by at least certain other of the fixed and movable beams. The first and second sensors are located within the MEMS device so as to produce signals of substantially identical characteristics. A circuit is responsive to the first and second sensors for comparing the signals produced by the first and second sensors. In addition to the apparatus, methods of performing a self test are also disclosed, which may be performed in real time.

13 Claims, 4 Drawing Sheets

U.S. PATENT DOCUMENTS 6,868,726 B2 3/2005 Lemkin et al.
7,086,270 B2* 8/2006 Weinberg et al. ............ 73/1.38

OTHER PUBLICATIONS

R. Lal, P.R. Apte, N.K. Bhat, G. Bose, S. Chandra, and D.K. Sharma, "MEMS: Technology, Design, CAD and Applications," pp. 24-25, Jan. 2002.

S. Cass, "MEMS in Space," IEEE Spectrum, vol. 38, Issue 7, pp. 56-61, Jul. 2001.

D.C. Hutchison, K. Ohara, and A. Takeda, "Application of Second Generation Advanced Multimedia Display Processor (AMDP2) in a Digital Micro-Mirror Array Based HDTV,".

R.S. Payne, S. Sherman, S. Lewis, and R.T. Howe, "Surface Micromachining: From Vision to Reality to Vision," Proc. of International Solid State Circuits Conference.

R. Oboe, "Use of MEMS Based Accelerometers in Hard Disk Drives," Proc. of International Conference on Advanced Intelligent Mechatronics, vol. 2, pp. 1142-1147, 2001.

A. Hartzell and D. Woodilla, "Reliability Methodology for Prediction of Micromachined Accelerometer Stiction," Proc. of Reliability Physics Symposium, pp. 202-205, Mar. 1999.

N. Deb and R.D. (Shawn) Blanton, "Analysis of Failure Sources in Surface-Micromachined MEMS," Proc. International Test Conference, pp. 739-749, Oct. 2000.

D. De Bruyker, A. Cozma, and R. Puers, "A Combined Piezoresistive/Capacitive Pressure Sensor With Self-Test Function Based on Thermal Actuation," Proc. Solid State Sensors and.

H.V. Allen, SC.C. Terry, and D.W. De Bruin, "Self-Testable Accelerometer Systems," Proc. Micro Electrol Mechanical Systems, pp. 113-115, 1989.

B. Charlot, S. Mir, F. Parrain, and B. Courtois, "Electrically Induced Stimuli for MEMS Self-Test," Proc. VLSI Test Symposium, pp. 210-215, Apr.-May 2001.

R. Rosing, A. Lechner, A. Richardson, and A. Dorey, "Fault Simulation and Modelling of Microelectromechanical Systems," Computing and Control Engineering Journal, vol. 11.

A. Kolpekwar, R.D. Blanton, and D. Woodilla, "Failure Modes for Stiction in Surface-Micromachined MEMS," Proc. of International Test Conference, pp. 551-556, Oct. 1998.

T. Jiang and R.D. Blanton, "Particulate Failures for Surface-Micromachined MEMS," Proc. of International Test Conference, pp. 329-337, Sep. 1999.

H. Luo, G.K. Fedder, and L.R. Carley, "A 1 mG CMOS-MEMS Accelerometer," Proc. of Micro Electro Mechanical Systems, pp. 502-507, Jan. 2000.

W.C. Tang, T.-C.H. Nguyen, M.W. Judy, and R.T. Howe, "Electrostatic Comb Drive of Lateral Polysilicon Resonators," Sensors and Ctuators A, vol. 21, Nos. 1-3, pp. 328-331.

J. Xuesong, J.I. Seeger, M. Kraft, and B.E. Boser, "A Monolithic Surface Micromachined Z-axis Gyroscope with Digital Output," Symposium on VLSI Circuits, pp. 16-19, 2000.

N. Deb and R.D. Blanton, "High-Level Fault Modeling in Surface-Micromachined MEMS," Proc. of Design, Test, Integration, and Packaging of MEMS/MOEMS, pp. 228-235, May 2000.

J. Wu, G.K. Fedder, and L.R. Carley, "A Low-Noise Low-Offset Chopper-Stabilized Capacitive-readout Amplifier for CMOS MEMS Accelerometers," Proc. of International Solid State.

O. Tabata, K. Terasoma, N. Agawa, and K. Yamamoto, "Moving Mask LIGA (M/sup2/LIGA) Process for Control of Side Wall Inclination," Proc. of Micro Electro Mechanical Systems.

S.V. Iyer, H. Lakdawala, G.K. Fedder, and T. Mukherjee, "Macromodeling Temperature-Dependent Curl in CMOS Micromachined Beams," Proc. of Modeling and Simulation of.

Q. Jing, H. Luo, T. Mukherjee, L.R. Carley, and G.K. Fedder, "CMOS Micromechanical Bandpass Filter Design Using a Hierarchical MEMS Circuit Library," Proc. of Micro Electro.

D.A. Koester, R. Mahadevan, and K.W. Markus, MUMPS Introduction and Design Rules, MCNC MEMS Technology Applications Center, 3021 Cornwallis Road Research Triangle Park, NC.

* cited by examiner

| APPLIED VOLTAGE | NORMAL OPERATION | SELF-TEST OPERATION |
|---|---|---|
| $V_{act}$ | | $F_1, F_3, F_5, F_7$ |
| $V_{nom}$ | $F_1$-$F_8$<br>$M_1$-$M_4$<br>$D_1$-$D_8$<br>$B_1$-$B_4$ | $F_2, F_4, F_6, F_8$<br>$M_1$-$M_4$<br>$D_5$-$D_8$ |
| $V_{mp}$ | $S_1, S_3, S_5, S_7$ | $S_1, S_4, S_5, S_8$<br>$D_1, D_3$ |
| $V_{mn}$ | $S_2, S_4, S_6, S_8$ | $S_2, S_3, S_6, S_7$<br>$D_2, D_4$ |

BUILT-IN SELF TEST OF MEMS

CROSS REFERENCE TO RELATED APPLICATIONS

This application is a divisional application of U.S. application Ser. No. 10/666,147 filed Sep. 18, 2003, now U.S. Pat. No. 7,152,474, and entitled Built-in Self Test of MEMS, which claims priority from provisional application Ser. No. 60/411,703 filed Sep. 18, 2002 and entitled Built-In Self Test of CMOS-MEMS Accelerometers, the entirety of which is hereby incorporated by reference.

STATEMENT REGARDING FEDERALLY SPONSORED RESEARCH

This work was sponsored by the National Science Foundation under grant MIP-9702678. The federal government may have rights in this invention.

BACKGROUND

The present disclosure is directed to a built-in, self-test technique for MicroElectroMechanical systems (MEMS) that is applicable to symmetrical microstructures or other structures in which signals of equal magnitude and opposite polarity can be produced.

MEMS are complex, heterogeneous systems consisting of devices whose operation is based on the interactions of multiple energy domains. Commercial manufacture of MEMS has increased the need for cost-effective test methods that screen defective devices from good ones. With MEMS becoming increasingly complex and finding use in life-critical applications such as air-bags, bio-sensors, and aerospace applications, there is a growing need for robust fault models and test methods.

Of the currently used MEMS process technologies, surface micromachining is a popular one due to its well-developed infrastructure for depositing, patterning and etching of thin films for silicon integrated circuits. Surface micromachining enables the fabrication of high-quality MEMS devices because it is based on thin-film technology that combines control and flexibility in the fabrication process.

A MEMS test may include the process of identifying good devices in a batch of fabricated devices. The normal assumption is that the design is correct so the test process is one of verifying that the fabricated device is equivalent to the design. However, a device that passes a traditional, specification-based test may fail later during in-field operation. For example, a mechanical beam of an accelerometer may become stuck to the die surface due to a phenomenon known as stiction. A stuck beam may mimic behavior similar to a device affected by an expected level of under-etch. Under-etch refers to a release step where sacrificial material is removed to release or free the microstructure. The release typically requires an etching step, and in the case where an under-etch occurs, insufficient sacrificial material may be removed. By adjusting the electronics, an accelerometer suffering from stiction can be easily calibrated to meet its operational specification. The danger, however, is that an accelerometer with a stuck beam may release in the field (i.e. defect healing) causing the accelerometer to go out of calibration, which can then possibly lead to failure. Detection or prevention of field failures can be accomplished through built-in self test (BIST).

As MEMS become more complicated and find a wider range of applications, the need for on-chip self-test features will grow. BIST for the testing of MEMS is yet to be common practice. However, progress in this area has been recently made. The work in De Bruyker et al., "A Combined Piezoresistive/Capacitive Pressure Sensor with Self-test Function based on Thermal Actuation," *Proc. Solid State Sensors and Actuators*, Vol. 2, pp. 1461-1464 (1997) describes the self-test of a pressure sensor. In their approach, thermal actuation of the sensor's diaphragm is performed by driving current through a resistive heater. The heat generated increases the temperature of the air in the sensor's cavity creating a pressure that displaces the diaphragm. Using a similar technique, the authors Charlot et al., of "Electrically Induced Stimuli for MEMS Self-Test," *Proc. VLSI Test Symposium*, pp. 210-215 (April-May 2001) use resistive heaters to increase the temperature of a MEMS infrared-imager array. Many commercial accelerometers use a self-test technique similar to the one described in Allen et al., "Self-Testable Accelerometer Systems," *Proc. Micro Electro Mechanical Systems*, pp. 113-115 (1989). In that approach, dedicated mechanical beams are used to generate an electrostatic force that mimics an external acceleration. It is useful for determining if the accelerometer's mechanical microstructure is free to move. This technique cannot be used until the electrostatic force is calibrated after testing has been performed to determine if the part has been manufactured correctly. Finally, an idea for accelerometer self-test that exploits design symmetry is suggested in Rosing et al., "Fault Simulation and Modeling of Microelectromechanical Systems," *Computing and Control Engineering Journal*, Vol. 11, Issue 5, pp. 242-250 (October 2000). They propose to actuate the accelerometer one side at a time and then compare the two outputs obtained to detect any anomaly.

Commercially-manufactured devices such as accelerometers are usually affected by multiple failure sources. Failure sources for MEMS include, but are not limited to, foreign particles, etch variations, and stiction, each of which can lead to a variety of defects. For example, it is known that particles can lead to defects that include broken and bridged structures with corresponding behaviors that range between benign and catastrophic. Many of these failure sources exhibit very similar misbehaviors and are difficult to distinguish from each other.

Currently, self-test of commercial accelerometers is limited. BIST techniques used in industry (See Allen et al., "Self-Testable Accelerometer Systems," *Proc. Micro Electro Mechanical Systems*, pp. 113-115 (1989)) are focused on input stimulus generation. In accelerometers produced by Analog Devices, Motorola and others, the accelerometer's shuttle is moved to its maximum position using actuation fingers so that the full-scale sense output is generated. The inability to generate a full-scale output, within some tolerance limits, means the accelerometer has failed self test. Using this form of BIST for testing is difficult because the amount of actuation voltage needed can be determined only after the part has been tested and calibrated. It is also ineffective for distinguishing misbehavior stemming from different sources. For example, a BIST output that is larger (smaller) than expected can be either caused by over-etch (under-etch) or broken (stuck) beams. Hence, its ability to identify hard-to-detect defects (e.g., asymmetry due to local defects) is limited.

In the BIST technique proposed in Rosing et al., supra, the accelerometer's shuttle is moved twice, once using the right actuation fingers and again using the left actuation fingers. Failure results when the two resulting sense outputs do not match, presumably, within some tolerance level. Unlike the techniques currently used in industry, this method does not necessarily require calibration before it can be used. However, its ability to identify hard-to-detect defects is limited because all test observations are made from the normal sense output. Moreover, it is difficult to implement on chip because sample-and-hold circuitry is required to store the first measurement.

SUMMARY

According to one embodiment of the disclosure, the improvement in a symmetric MEMS device comprises first and second sensors electrically isolated from one another and positioned to produce signals of substantially identical characteristics (e.g, producing signals of equal magnitude but opposite polarity). A circuit is responsive to the sensors for comparing the signals produced by the sensors. The comparison may be performed in real time.

According to another embodiment of the disclosure, a MEMS device comprises a plurality of fixed beams arranged symmetrically and a plurality of movable beams arranged symmetrically. A first sensor is formed by certain of the fixed and movable beams while a second sensor is formed by at least certain other of the fixed and movable beams. The first and second sensors are symmetrically located within the MEMS device. A circuit is responsive to the first and second sensors for comparing signals produced by the first and second sensors. The comparison may be performed in real time.

The present disclosure is also directed to a method comprising actuating a MEMS device and comparing the outputs from a first and a second sensor, each electrically isolated from one another and positioned to produce signals of substantially identical characteristics. The sensors may be symmetrically located and the method may be carried out in real time.

A combination of existing layout features and additional circuitry is used to make measurements from various points in a MEMS. In addition to the normal sense output, self-test outputs are used to detect the presence of layout asymmetry that are caused by local, hard-to-detect defects. Simulation results for an accelerometer reveal that the disclosed approach is able to distinguish misbehavior resulting from local defects and manufacturing process variations.

BRIEF DESCRIPTION OF THE DRAWINGS

For the present disclosure to be easily understood and readily practice, the disclosure will now be described, for purposes of illustration and not limitation, in conjunction with the following figures where.

DESCRIPTION

This disclosure describes a BIST approach that samples outputs from symmetrically-located nodes of a MEMS microstructure. Increasing observability in this way allows one to identify misbehavior resulting from local defects as opposed to more benign causes. The disclosed BIST approach builds upon the fully differential sensing technique described in Luo et al., "A 1 mG Lateral CMOS-MEMS Accelerometer," *Proc. of Micro Electro Mechanical Systems*, pp 502-507 (January 2000) and applies to a broad class of sensors and actuators that includes resonators, accelerometers, and gyroscopes. Examples of symmetric MEMS devices that fall within the scope of the disclosed BIST approach are illustrated in FIG. 1. We have focused on CMOS-MEMS because the availability of multiple routing layers makes BIST in CMOS-MEMS more easily implemented than in technologies where the routing of wires is limited; other types of batch-fabrication techniques may be used.

In our previous work we have shown that changes in device behavior due to global manufacturing variations (such as over/under-etch) may mimic those caused by point defects (such as particles). In such cases of misbehavior overlap, distinguishing between various failure sources becomes difficult. Among failure sources exhibiting similar misbehavior, the potential long-term effects of some are expected to be more harmful than others. Because misbehavior overlap hampers defect diagnosis, it also prevents more harmful defects from being distinguished from those which are benign. The BIST approach disclosed here resolves that issue through differential actuation and sensing. Our method uses existing device features to produce two signals that should be identical in the nominal design but are unequal when asymmetry exists. The disclosed BIST allows one to distinguish between harmful defects that cause asymmetries as opposed to those that preserve layout symmetry. Structural deformations that preserve layout symmetry are usually caused by normal process variations. Because those changes are permanent, it is safe to compensate for those variations through electronic calibration.

Figure 1A:
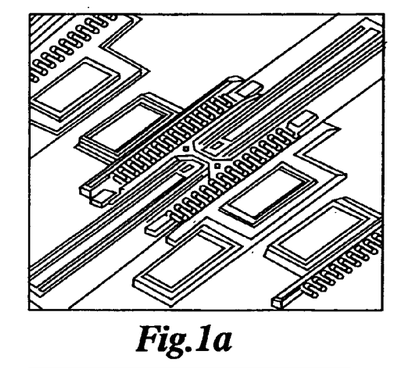
FIGS. 1A-1F illustrate various examples of symmetric MEMS devices such as (A) microresonator, (B) accelerometer, (C) gyroscope, (D) array of RF-MEMS switches in an antenna, (E) micromotor, and (F) ink-jet print head microsystem with 50 nozzles.
Figure 1B:
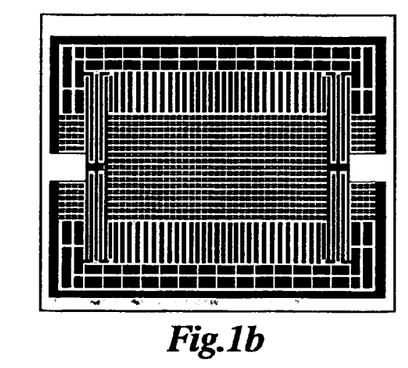
Figure 1C:
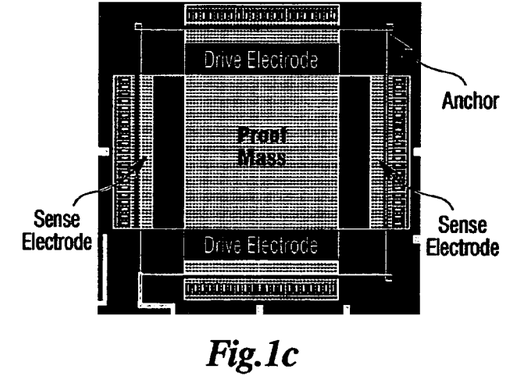
Figure 1D:
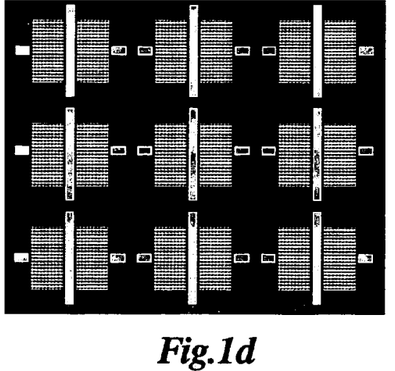
Figure 1E:
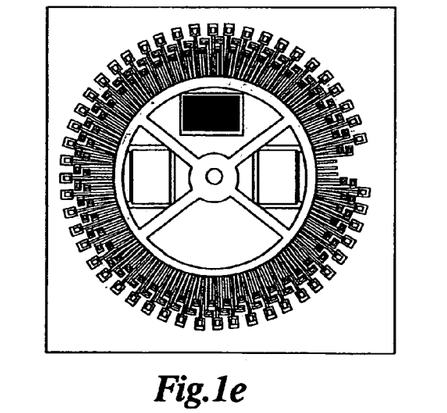
Figure 1F:
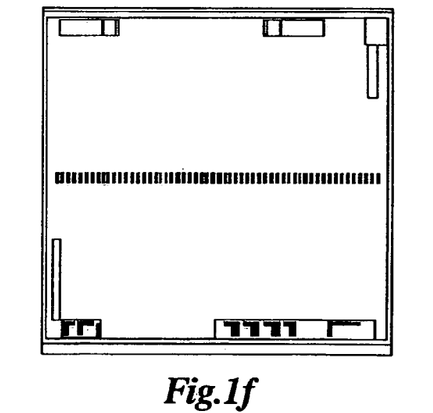
Figure 2:
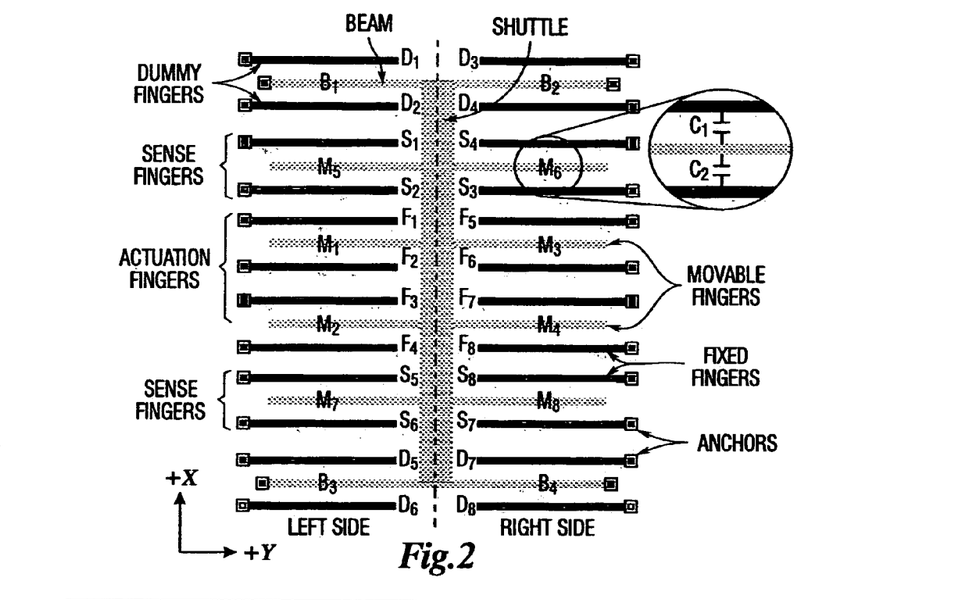
FIG. 2 is a simplified top view of an accelerometer's mechanical microstructure.

The BIST of the present disclosure is explained in the context of a CMOS-MEMS accelerometer for purposes of explanation and not limitation. A simplified view of an accelerometer's mechanical microstructure is shown in FIG. 2. For purposes of clarity, we have omitted details of the serpentine spring structure, the multi-layered device structure, routed interconnects, and the like.

A MEMS accelerometer is a transducer that converts translational acceleration to an electrical signal that is typically a voltage. An accelerometer's mechanical component (i.e., the sensor) can be viewed as a collection of primitive microstructures that include beams, anchors and a plate called the shuttle. Anchors attach beams to the die surface only at the positions shown in FIG. 2. Anchored beams connected to the shuttle act as springs because they create a restoring force when the shuttle moves as a result of an input acceleration. The remaining beams are typically referred to as "fingers".

Accelerometer fingers are partitioned into two classes: fixed and movable. Fixed fingers are anchored to the die surface and therefore are not free to move. Movable fingers are attached to the shuttle and therefore can move along with the shuttle. Subsets of fixed and movable fingers also serve various purposes. The sense fingers enable measurement of shuttle movement in the X direction while actuation fingers are used to create an electrostatic force that moves the shuttle for testing purposes. Dummy fingers are not involved in the normal operation of the accelerometer but are used to enhance the manufacturability of the device.

An accelerometer's sensor behaves as a linear second-order system similar to a spring-mass-damper system. As already mentioned, the beams attached to the top and bottom of the shuttle act as restoring springs. The shuttle is capable of motion by virtue of the flexibility provided by these so-called spring beams. Motion at or near the anchor points is negligible so locations farthest away from the anchors experience the greatest amount of movement. Damping of the accelerometer is caused by the air surrounding it.

In response to an input acceleration, the shuttle moves from its resting position until the restoring force of the spring beams balances the inertial force caused by the acceleration. Each triplet of fixed-movable-fixed fingers constitutes a pair of capacitors, $C_1$ and $C_2$, as shown in FIG. 2. At rest, the two capacitors are equal. Shuttle movement however causes the value of one capacitor to increase and the other to decrease. Shuttle movement is detected or "sensed" by electronics that detects change in the capacitances. With modulation voltage signals (e.g., high frequency pulse train) of opposite phases applied to the fixed fingers, the finger triplet is a potential divider with the voltage output of the movable finger serving as the output sense signal. In a fully-differential sensing scheme, one phase of the modulation voltage ($V_{mp}$) is applied to the finger pairs [$S_1S_3$] and [$S_5S_7$] and the other phase ($V_{mn}$) is applied to [$S_2S_4$] and [$S_6S_8$] (see FIG. 5A and FIG. 2). A sense signal from electrically-connected sense fingers on the left ($M_5$ and $M_7$) and right ($M_6$ and $M_8$) sides are connected to inputs $A_1$ and $A_2$ of a differential amplifier (FIG. 4), respectively, where the primary sense outputs $V_{sp}V_{s1}V_{s2}$ and $V_{sn}V_{s2}V_{s1}$ are produced. The fully-differential scheme of sensing has the advantage of rejecting any noise that is common to the left and right sides of the sensor.

An electrostatic attraction force can be created to displace the shuttle for testing. The voltage of the movable fingers for a shuttle at rest is called the nominal voltage (Vnom), and is simply the average of the modulation signal, namely $1/T \int_0^T V_{mp} dt$. Electrostatic actuation in the positive X direction is achieved by applying the actuation signals (Vact), usually DC or low frequency, to fingers [$F_1,F_3,F_5,F_7$] and the nominal voltage to the fingers [$F_2,F_4,F_6,F_8$], [$M_1$-$M_4$], and [$D_1$-$D_8$] (see FIG. 2).

Figure 4:
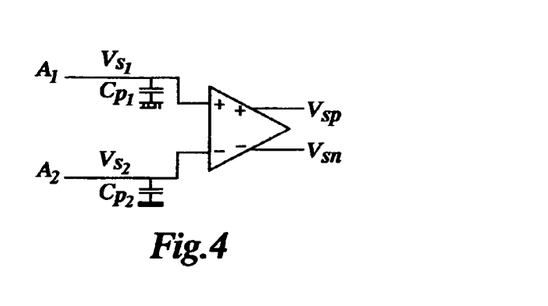
FIG. 4 is a schematic of a differential amplifier.
Figure 5A:
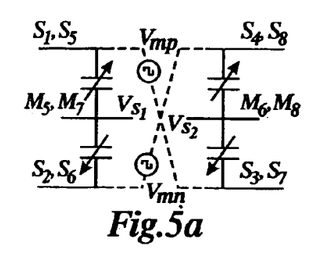
FIGS. 5A-5C are schematics showing the modulation schemes for (A) fully differential normal operation, (B) differential BIST operation using normal sense fingers and (C) differential BIST operation using spring beams.

The differential BIST approach disclosed herein detects hard-to-detect defects that occur during manufacture or operation in the field. Its differential nature implies that it is independent of any calibration and therefore is also suitable for testing purposes. The disclosed BIST allows one to distinguish between defects that lead to asymmetries as opposed to those more benign deformations that preserve layout symmetry. The disclosed BIST is primarily targeted at defect escapes, that is, those MEMS parts that would be viewed as good parts due to the inability of current test practices to identify them as defective. The self-test technique is focused on observation and therefore complements existing and proposed approaches that focus on stimulus generation. It creates and compares signals from pairs of symmetrically-located points on the accelerometer's micromechanical structure. Specifically, these sense points include the normal sense fingers and the spring beams that are surrounded by dummy fingers. Dummy fingers are manufacturing-enhancing structures located near the spring beams (see FIG. 2). They are used to ensure that the spring beams have etch-loading properties similar to those experienced by the movable and fixed fingers. During self-test, the dummy fingers may have additional modulation signals applied and the spring beams are used as additional sensing signals. The differential amplifier of FIG. 4 is used to detect any difference between symmetrically-located fingers and beams. The signal nodes that are compared must all be electrically isolated from each other, a feature that is easily achieved using the multiple routing layers available in a CMOS process. For each sense-point pair, a separate differential amplifier is used. Additional amplifiers for self-test increases cost in terms of area overhead but has the advantage of reduced parasitic capacitance and interference. Local defects that introduce undesirable asymmetry between the left and right sides will cause the two symmetrically located sense outputs, $V_{s1}$ and $V_{s2}$, to be unequal. If the difference $|V_{s1}-V_{s2}|>T$, where T is some pre-determined threshold, then asymmetry is detected. The polarity of the difference signal $V_{s1}-V_{s2}$ also grossly localizes the defect site. For example, a contamination that creates a high-resistive bridge between fingers $F_1$ and $M_1$ will hinder the motion of the sensor's left side more than that of the right side. Hence, the right sense output $V_{s1}$ (from [$M_5,M_7$]) will be less than $V_{s2}$ (from [$M_6,M_8$]) causing $V_{s1}-V_{s2}$ to be negative. In the opposite case, $V_{s1}-V_{s2}$ will be positive.

Figure 3:
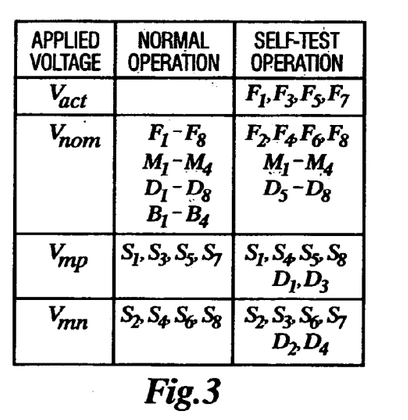
FIG. 3 is a table illustrating microstructure voltage biasing for normal and self-test operations.
Figure 5B:
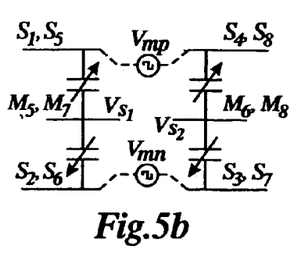

The operational details of one embodiment of the self-test scheme are now explained. To move the shuttle in the positive X direction, the nominal voltage is applied to fingers [$F_2F_4F_6F_8$], [$M_1$ $M_4$], and [$D_5D_8$] and actuation voltages are applied to fingers [$F_1F_3F_5F_7$] (see FIG. 2 and FIG. 3). The sense signal is sampled from different pairs of points. Sensing from the regular sense fingers for self-test purposes can be easily achieved by the scheme illustrated in FIG. 5B. Modulation signals of one phase ($V_{mp}$) are applied to the finger pairs [$S_1S_4$] and [$S_5S_8$] while those of the other phase ($V_{mn}$) are applied to the finger pairs [$S_2S_3$] and [$S_6S_7$]. Note that this scheme is derived from the nominal one shown in FIG. 5A by interchanging the phases of the modulation signals on the right side. Sense signals from finger pairs [$M_5M_7$] and [$M_6M_8$] are directed to the inputs $A_1$ and $A_2$, respectively, of a dedicated differential amplifier like the one shown in FIG. 4.

Figure 5C:
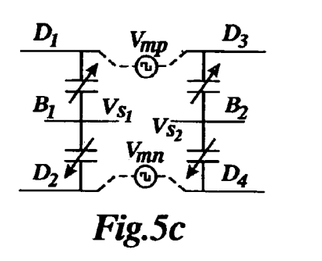

For sensing from the spring beams, opposite phases of modulation signals are applied to dummy finger pairs [$D_1D_3$] and [$D_2D_4$] (see FIG. 5C). The sense signals from spring beams $B_1$ and $B_2$ are directed to the inputs $A_1$ and $A_2$, respectively, of another dedicated differential amplifier. The use of dedicated amplifiers, and sensors electrically isolated from one another, enables real time comparison and analysis if desired.

Self-test using movement in the negative X direction can be achieved in a similar fashion. The multi-conductor nature of CMOS-MEMS allows extensive routing and electrical isolation of fingers that are mechanically connected to the same shuttle, characteristics that make implementation of this BIST approach practicable. For example, in CMOS-MEMS, the sense voltage outputs from the spring beams can be electrically isolated very easily. This type of electrical isolation is much harder to achieve in other processes such as MUMPS because of its single conducting layer.

The accelerometer is susceptible to both global and local manufacturing variations. Because the disclosed BIST technique detects left-right asymmetry, it is clear that global variations will affect both sides equally and therefore $V_{s1}$ and $V_{s2}$ will be affected equally, implying $V_{s1}$ $V_{s2}$ will, in theory, be unaffected. But local manufacturing variations (such as local over/under etch, curvature variations, etc.) that lead to left-right asymmetry will result in unequal actuation forces on the left and right sides which in turn will lead to unequal sense outputs. Hence, this self-test approach is sensitive to local variations while being immune to global variations. For this reason, the difference $V_{s1}$ $V_{s2}$ or the ratio $V_{s1}$ $V_{s2}$ is more significant than the absolute values of $V_{s1}$ and $V_{s2}$.

Ideally, the self-test mechanism itself must not falsely indicate device failure. So the self-test actuation scheme should prevent the sense signal from being corrupted by the actuation signal even in the presence of left-right asymmetry caused by local manufacturing variations. The differential nature of the disclosed process guarantees that the actuation signal (i.e., voltage) of each polarity is equally applied to both the left and right sides. In short, one polarity is applied to the fingers [$F_1F_7$] and the other to [$F_3F_5$]. If, for example, the inter-finger capacitors on the right side are smaller than those on the left side, the resulting currents will therefore be unequal (less on the right side). The differential nature of the disclosed approach guarantees that current due to the actuation signal of each polarity has contributions from both the left (higher capacitance) and right (lower capacitance) sides. Therefore, the total current of each polarity is the same. Hence, given first-order manufacturing variations, the currents of the two polarities cancel and do not contribute to the differential self-test sense signal.

Analysis

In the following, we formally show how the disclosed BIST for symmetric MEMS is able to detect and identify various forms of asymmetry introduced by perturbations in the manufacturing process. Specifically, the analysis is applied to a MEMS accelerometer; however similar analyses can be applied to other types of symmetric MEMS.

Figure 6:
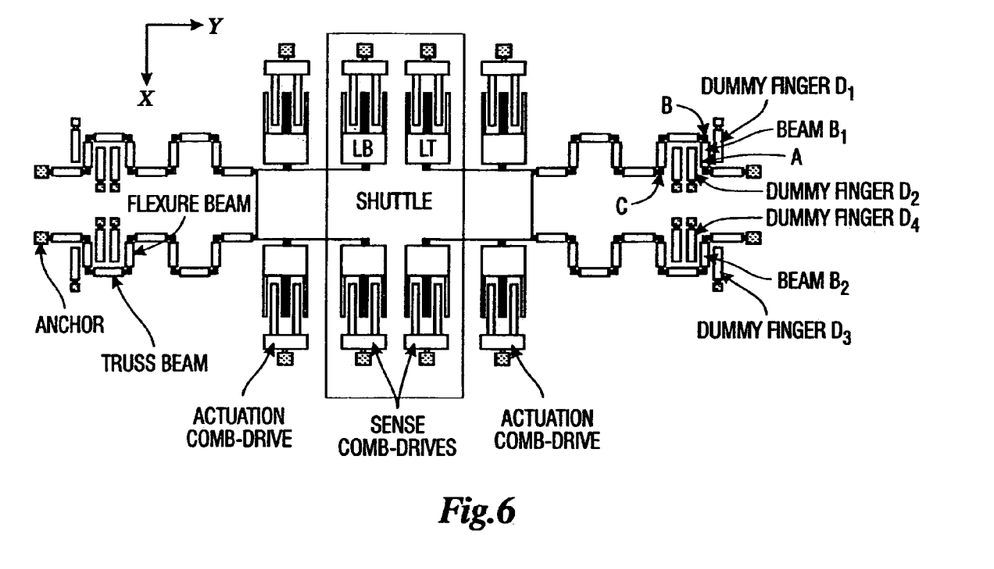
FIG. 6 illustrates the topology of a test accelerometer showing the serpentine springs.
Figure 7:
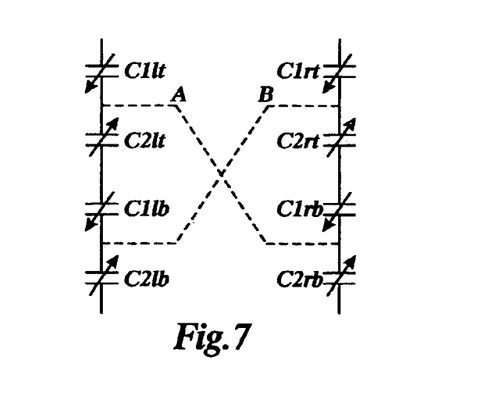
FIG. 7 illustrates sets of comb-drives, each showing a pair of capacitors and two free nodes.

We first analyze how the sense comb capacitances, under different modulation schemes, interact to produce a sense signal that may or may not depend on first-order local manufacturing variations. Note from FIG. 6 that the accelerometer (used as an example of a symmetric MEMS structure) has four identical, symmetrically-located sense comb-drives. The network constituted by the capacitances in the four sense comb-drives is shown in FIG. 7. The symbols 'l', 'r', 'b', and 't' denote left, right, bottom and top, respectively. The symbols '1' and '2' denote the two capacitors of a differential pair. For shuttle motion in the +Y direction, all capacitors with a suffix of '1' decrease, while all capacitors with a suffix of '2' increase. The opposite holds true for motion in the −Y direction.

The following assumptions are true for the comb-capacitances displayed in FIG. 7.

1. Each pair of capacitors constitutes a potential divider circuit with the potentials applied at the free node (modulation node) of each capacitor and voltage sensed from their common node (sense node). Thus, each pair has one sense node and two modulation nodes.
2. Each pair must have different voltages applied at their modulation nodes, for the sense node output to be sensitive to change in the capacitances. Usually the modulation signals are applied in opposite phases. Therefore each capacitor pair can be considered a dipole.
3. The number of freedoms associated with each dipole is $m(m-1)$, where m is the number of phases of the applied modulation signal. Hence, a dipole can be in any one of the $m(m-1)$ possible modulation states.

Based on the above assumptions, we can find out the number of modulation schemes possible for a capacitive network.

1. In our case, each dipole can have two possible states, represented by the symbols 1 or 0. Every dipole has two capacitors, one with '1' in the suffix and the other with '2' in the suffix. If the positive phase ($V_{mp}$) of the modulation signal is applied to the free node of the capacitor with suffix '1', then the negative phase ($V_{mn}$) of the modulation signal, naturally, is applied to the free node of the capacitor with suffix '2', and the dipole is said to be in state 0.
2. A capacitive network consisting of n dipoles can be in one of $2^n$ states. However, exchange of the two modulation signals for all the dipoles will change nothing (except polarity of sense output). Hence, only $2^{n-1}$ states need to be considered. In our case, n=4, which implies only 8 states of the network need to be analyzed. This number can be further reduced by the heuristic that only states that have equal number of 1's and 0's are interesting, besides the all-zero state (or the all-one state). This translates to a value of 4.

TABLE 1

Definitions of symbols.

| Symbol | Definition |
|---|---|
| $C_0$ | Nominal value of a sense capacitor of a dipole, in absense of any local and global manufacturing variations |
| $\delta$ | Nominal value of the change in a sense capacitor of a dipole, in absense of any local and global manufacturing variations, for a specified displacement. Note that $|\delta/C_0| \leq 0.05$. |
| $C_p$ | Total parasitic capacitance between a sense node and ground. It includes amplifier input capacitance, inter-connect capacitance, and all other capacitors connected (from non-sensing nodes) to the sense node. |
| $C_{total}$ | Total capacitance between a sense node and ground. |
| $V_A$ | Sense voltage output at node A |
| $V_B$ | Sense voltage output at node B |
| $S_i$ | A binary variable associated with dipole i. Its value is =1, if dipole i is in state 0 =−1, if dipole i is in state 1 |
| $\lambda_i$ | Effective local manufacturing variation factor for the capacitances of dipole i. Its value is unity in absence of any manufacturing variations. It is assumed to be constant for small (typical) displacements of the movable parts of the device. |

If we impose the condition that the sum of the capacitors in a dipole is constant (for small displacements), we can obtain (using the symbol definitions in Table 1) the unified expression for all modes as:

$$\frac{\Delta V_B - \Delta V_A}{V_{mp} - V_{mn}} = \frac{S_{lb}\Delta C_{1lb} + S_{rt}\Delta C_{1rt}}{(C_{1lb} + C_{2lb}) + (C_{1rt} + C_{2rt}) + C_{P_B}} - \frac{S_{lt}\Delta C_{1lt} + S_{rb}\Delta C_{1rb}}{(C_{1lt} + C_{2lt}) + (C_{1rb} + C_{2rb}) + C_{P_A}} \quad (1)$$

Table 2 lists the values of comb capacitances in the presence of manufacturing variations. Based on the symbol definitions in Table 1 and the values listed in Table 2, we have $$\Delta C_{1lt} = -\delta\lambda_{lt},\ \Delta C_{1rb} = -\delta\lambda_{rb},\ \Delta C_{1lb} = -\delta\lambda_{lb},$$

$$\Delta C_{1rt} = -\delta\lambda_{rt},\ C_{A_{total}} = 2C_0(\lambda_{lt} + \lambda_{rb}) + C_{P_A},$$

$$C_{B_{total}} = 2C_0(\lambda_{lb} + \lambda_{rt}) + C_{P_B}.$$

Using these values in Equation 1, the change in the differential sense output voltage is:

$$\frac{\Delta V_B - \Delta V_A}{V_{mp} - V_{mn}} \cdot \frac{2C_0}{\delta} = \frac{S_{lt}\lambda_{lt} + S_{rb}\lambda_{rb}}{\lambda_{lt} + \lambda_{rb} + \frac{C_{P_B}}{2C_0}} - \frac{S_{lb}\lambda_{lb} + S_{rt}\lambda_{rt}}{\lambda_{lb} + \lambda_{rt} + \frac{C_{P_B}}{2C_0}} \quad (2)$$

$$= \frac{\lambda_{lt}\lambda_{lb}(S_{lt} - S_{lb}) + \lambda_{rb}\lambda_{lb}(S_{rb} - S_{lb}) + \lambda_{lt}\lambda_{rt}(S_{lt} - S_{rt}) + \lambda_{rb}\lambda_{rt}(S_{rb} - S_{rt}) + \frac{C_{P_B}}{2C_0}(S_{lt}\lambda_{lt} + S_{rb}\lambda_{rb}) - \frac{C_{P_A}}{2C_0}(S_{lb}\lambda_{lb} + S_{rt}\lambda_{rt})}{\left(\lambda_{lt} + \lambda_{rb} + \frac{C_{P_A}}{2C_0}\right)\left(\lambda_{lb} + \lambda_{rt} + \frac{C_{P_B}}{2C_0}\right)}$$

Using the expressions in Equation 2, we represent the states of the capacitive network (shown in FIG. 7) in the form of a truth table in Table 3. In Table 3, the most interesting modes are those that have an even number of 1's. Four such modes exist, all of which have been named as shown.

TABLE 2

Comb capacitance values at nominal (assuming no DC-offset) and displaced positions.

| Capacitance | Value at nominal position | Value at displaced position |
|---|---|---|
| $C_{1lt}$ | $C_0\lambda_{lt}$ | $(C_0 - \delta)\lambda_{lt}$ |
| $C_{2lt}$ | $C_0\lambda_{lt}$ | $(C_0 + \delta)\lambda_{lt}$ |
| $C_{1rb}$ | $C_0\lambda_{rb}$ | $(C_0 - \delta)\lambda_{rb}$ |
| $C_{2rb}$ | $C_0\lambda_{rb}$ | $(C_0 + \delta)\lambda_{rb}$ |
| $C_{1lb}$ | $C_0\lambda_{lb}$ | $(C_0 - \delta)\lambda_{lb}$ |
| $C_{2lb}$ | $C_0\lambda_{lb}$ | $(C_0 + \delta)\lambda_{lb}$ |
| $C_{1rt}$ | $C_0\lambda_{rt}$ | $(C_0 - \delta)\lambda_{rt}$ |
| $C_{2rt}$ | $C_0\lambda_{rt}$ | $(C_0 + \delta)\lambda_{rt}$ |

TABLE 3

Modulation states of comb capacitances.

| Dipole states | | | | Normalized sense outputs | Mode names |
|---|---|---|---|---|---|
| $C_{1lt}:C_{2lt}$ | $C_{1rb}:C_{2rb}$ | $C_{1lb}:C_{2lb}$ | $C_{1rt}:C_{2rt}$ | $(\Delta V_B - \Delta V_A)/(V_{mp} - V_{mn})$ | |
| 0 | 0 | 0 | 0 | $\delta\frac{\lambda_{lt} + \lambda_{rb}}{2C_0(\lambda_{lt} + \lambda_{rb}) + C_{P_A}} - \delta\frac{\lambda_{lb} + \lambda_{rt}}{2C_0(\lambda_{lb} + \lambda_{rt}) + C_{P_B}}$ | Self-test XY-mode |
| 0 | 0 | 0 | 1 | $\delta\frac{\lambda_{lt} + \lambda_{rb}}{2C_0(\lambda_{lt} + \lambda_{rb}) + C_{P_A}} - \delta\frac{\lambda_{lb} - \lambda_{rt}}{2C_0(\lambda_{lb} + \lambda_{rt}) + C_{P_B}}$ | |
| 0 | 0 | 1 | 0 | $\delta\frac{\lambda_{lt} + \lambda_{rb}}{2C_0(\lambda_{lt} + \lambda_{rb}) + C_{P_A}} + \delta\frac{\lambda_{lb} - \lambda_{rt}}{2C_0(\lambda_{lb} + \lambda_{rt}) + C_{P_B}}$ | |
| 0 | 0 | 1 | 1 | $\delta\frac{\lambda_{lt} + \lambda_{rb}}{2C_0(\lambda_{lt} + \lambda_{rb}) + C_{P_A}} + \delta\frac{\lambda_{lb} + \lambda_{rt}}{2C_0(\lambda_{lb} + \lambda_{rt}) + C_{P_B}}$ | Normal sense mode |

TABLE 3-continued

Modulation states of comb capacitances.

| Dipole states | | | | Normalized sense outputs | |
|---|---|---|---|---|---|
| $C_{1lt}{:}C_{2lt}$ | $C_{1rb}{:}C_{2rb}$ | $C_{1lb}{:}C_{2lb}$ | $C_{1rt}{:}C_{2rt}$ | $(\Delta V_B - \Delta V_A)/(V_{mp} - V_{mn})$ | Mode names |
| 0 | 1 | 0 | 0 | $\delta \dfrac{\lambda_{lt} - \lambda_{rb}}{2C_0(\lambda_{lt} + \lambda_{rb}) + C_{P_A}} - \delta \dfrac{\lambda_{lb} + \lambda_{rt}}{2C_0(\lambda_{lb} + \lambda_{rt}) + C_{P_B}}$ | |
| 0 | 1 | 0 | 1 | $\delta \dfrac{\lambda_{lt} - \lambda_{rb}}{2C_0(\lambda_{lt} + \lambda_{rb}) + C_{P_A}} - \delta \dfrac{\lambda_{lb} - \lambda_{rt}}{2C_0(\lambda_{lb} + \lambda_{rt}) + C_{P_B}}$ | Self-test Y-mode |
| 0 | 1 | 1 | 0 | $\delta \dfrac{\lambda_{lt} - \lambda_{rb}}{2C_0(\lambda_{lt} + \lambda_{rb}) + C_{P_A}} + \delta \dfrac{\lambda_{lb} - \lambda_{rt}}{2C_0(\lambda_{lb} + \lambda_{rt}) + C_{P_B}}$ | Self-test X-mode |
| 0 | 1 | 1 | 1 | $\delta \dfrac{\lambda_{lt} - \lambda_{rb}}{2C_0(\lambda_{lt} + \lambda_{rb}) + C_{P_A}} + \delta \dfrac{\lambda_{lb} + \lambda_{rt}}{2C_0(\lambda_{lb} + \lambda_{rt}) + C_{P_B}}$ | |

The combined effect of all local manufacturing variations on a dependent variable (like capacitance C distributed over an area) can be represented by $$C = C_{00} \int_A \lambda(\alpha, \beta) \frac{d\alpha d\beta}{A} \qquad (3)$$

where $\alpha$ and $\beta$ are length parameters in the area A. Note that in total absence of local variations, $$\lambda(\alpha,\beta)=1, \forall \alpha, \forall \beta,$$

which reduces Eq. 3 to the simple nominal relation, $$C=C_{00}$$

We assume a variable separable relation, $$\lambda(\alpha,\beta)=[1+X(\alpha)][1+Y(\beta)] \qquad (4)$$

which implies that local variations along X and Y axes are independent of each other. The condition $$X(\alpha)=Y(\beta)=0, \forall \beta, \forall \beta$$

implies no local variation. Note that $\alpha=\beta=0$ at the center of the layout. Using Eq. 4 in Eq. 3, the following expression for capacitance is obtained:

$$\begin{aligned} C &= C_{00} \int_A [1 + X(\alpha)][1 + Y(\beta)] \frac{d\alpha d\beta}{A} \\ &= C_{00} \int_{\alpha_1}^{\alpha_2} [1 + X(\alpha)] \frac{d\alpha}{\alpha_2 - \alpha_1} \int_{\beta_1}^{\beta_2} [1 + Y(\beta)] \frac{d\beta}{\beta_2 - \beta_1}, \end{aligned} \qquad (5)$$

where $$\begin{aligned} A &= (\alpha_2 - \alpha_1)(\beta_2 - \beta_1) \\ &= C_{00}[1 + \overline{X}][1 + \overline{Y}] \end{aligned}$$

We will use the above expression for representing comb capacitances in our analysis. The above expression uses the concept of average manufacturing variations because all signals are generated from the interaction of distributed capacitances.

Also, we assume $$C_{PA}=C_{PB}=C_P$$

(i.e., same parasitic capacitance at each of the differential sense output nodes, A and B). From these assumptions and Equation 2, the differential sense outputs for each mode are computed and tabulated in Table 4.

TABLE 4

| All modes | |
|---|---|
| | $\lambda_{lb}(\alpha^-, \beta^-) = [1 + X(\alpha^-)][1 + Y(\beta^-)]$ |
| | $\lambda_{lt}(\alpha^-, \beta^+) = [1 + X(\alpha^-)][1 + Y(\beta^+)]$ |
| | $\lambda_{rt}(\alpha^+, \beta^+) = [1 + X(\alpha^+)][1 + Y(\beta^+)]$ |
| | $\lambda_{rb}(\alpha^+, \beta^-) = [1 + X(\alpha^+)][1 + Y(\beta^-)]$ |
| | $\mu = \dfrac{C_p}{4C_0}$ |

TABLE 4-continued $$X_s = X(\alpha^+) + X(\alpha^-), Y_s = Y(\beta^+) + Y(\beta^-)$$

$$X_d = X(\alpha^+) - X(\alpha^-), Y_d = Y(\beta^+) - Y(\beta^-)$$

$$H(X_s, Y_s, X_d, Y_d) = \left[2\mu + \frac{(2+X_s)(2+Y_s)}{2}\right]^2 - \left(\frac{X_d Y_d}{2}\right)^2$$

Mode 0011
$$\Delta V_B - \Delta V_A = (V_{mp} - V_{mn})\frac{\delta}{C_0}\left[1 - \mu \cdot \frac{(2+X_s)(2+Y_s) + 4\mu}{H(X_s, Y_s, X_d, Y_d)}\right]$$

Mode 0110
$$\Delta V_B - \Delta V_A = (V_{mp} - V_{mn})\frac{\delta}{2C_0}(-X_d)\left[\frac{2\{1 + Y_s + Y(\beta^+)Y(\beta^-)\}(2+X_s) + 2\mu Y_s + 4\mu}{H(X_s, Y_s, X_d, Y_d)}\right]$$

Mode 0101
$$\Delta V_B - \Delta V_A = (V_{mp} - V_{mn})\frac{\delta}{2C_0}(+Y_d)\left[\frac{2\{1 + X_s + X(\alpha^+)X(\alpha^-)\}(2+Y_s) + 2\mu X_s + 4\mu}{H(X_s, Y_s, X_d, Y_d)}\right]$$

Mode 0000
$$\Delta V_B - \Delta V_A = (V_{mp} - V_{mn})\frac{\delta}{2C_0}(-X_d Y_d)\left[\frac{2\mu}{H(X_s, Y_s, X_d, Y_d)}\right]$$

If $X(\alpha)$ and $Y(\beta)$ are odd functions, we have $$X_s = Y_s = 0.$$

Also, for a normal manufacturing process, $$\left(\frac{X_d Y_d}{4}\right)^2 \ll 1$$

Under such conditions, the expressions of sensitivities of the modes in Table 4 reduce to the ones listed in Table 5.

TABLE 5

| Mode | $(\Delta V_B - \Delta V_A)/(V_{mp} - V_{mn})$ | Dependence |
|---|---|---|
| 0011 | $\frac{\delta}{C_0}\left[\frac{1}{1+\frac{C_p}{4C_0}}\right]$ | Independent of X and Y variations |
| 0110 | $\frac{\delta}{2C_0}(-X_d)\left[\frac{1+\frac{C_p}{4C_0}+Y(\beta^+)Y(\beta^-)}{\left(1+\frac{C_p}{4C_0}\right)^2}\right]$ | Dependent on X variations only |
| 0101 | $\frac{\delta}{2C_0}(+Y_d)\left[\frac{1+\frac{C_p}{4C_0}+X(\alpha^+)X(\alpha^-)}{\left(1+\frac{C_p}{4C_0}\right)^2}\right]$ | Dependent on Y variations only |
| 0000 | $\frac{\delta}{4C_0}(-X_d Y_d)\left[\frac{\frac{C_p}{4C_0}}{\left(1+\frac{C_p}{4C_0}\right)^2}\right]$ | Dependent on both X and Y variations |

Simulation Results

TABLE 6

| Parameter | Value | Unit |
|---|---|---|
| Resonant frequency ($f_x$) | 12.5 | kHz |
| Sensor sensitivity | 0.88 | mV/G |

TABLE 6-continued

| Parameter | Value | Unit |
|---|---|---|
| Modulation voltage amplitude | 5.0 | V |
| Actuation voltage amplitude | 1.5 | V |
| Input referred noise | 100 | μG/√Hz |
| Bandwidth of baseband sense signal | 500 | Hz |

A CMOS-MEMS accelerometer with the parameters listed in Table 6 is modified to include the necessary characteristics to implement the disclosed BIST approach. Specifically, switches are used to interchange the polarity of modulation signals applied to finger pairs [$S_3 S_7$] and [$S_4 S_8$], to control the application of modulation signals to the dummy fingers [$D_1 D_4$], and to select one of the two self-test difference signals if only one output pin is reserved for self-test. Simulation experiments are performed to examine the capability of this approach to detect asymmetry caused by: (i) a single dielectric particle acting as a bridge between a pair of structures where at least one is movable; (ii) a variation in vertical misalignment between fixed and movable fingers caused by curl mismatch; (iii) a variation in local etch; and (iv) unequal parasitics in the interconnects from the self-test sense points to the differential sense amplifier.

With respect to asymmetry caused by a single particle acting as a bridge, particles can originate from the clean room but also from the removal of the sacrificial layer during the release step. Particles formed out of the sacrificial layer can be as large as a few μm and are therefore large enough to act as bridges between structures. Simulation experiments were conducted using NODAS [See Jing et al., "CMOS Micromechanical Bandpass Filter Design Using a Hierarchical MEMS Circuit Library," *Proc. of Micro Electro Mechanical Systems Conference*, pp. 187-192 (January 2000)], and AHDL (Analog Hardware Descriptive Lan guage) simulator for mixed-domain circuits. NODAS has been shown to closely match experimental result. The efficacy of NODAS as a reliable and much faster simulator than finite element analysis has also been demonstrated. Both the electro-mechanical microstructure and electronic circuitry are simulated together. The electronic circuitry is based on a design [See Wu et al., "A Low-Noise Low-Offset Chopper-Stabilized Capacitive-readout Amplifier for CMOS MEMS Accelerometers," *Proc. of International Solid State Circuits Conference*, pp. 428-429 (February 2002)] that has been fabricated and validated with CMOS-MEMS devices.

One of the parameters used to decide pass/fail for an accelerometer is its resonant frequency ($f_x$) for translation in the X direction. The acceptable range for resonant frequency includes a maximum deviation of 25% from the nominal value, which translates to a range of 94 kHz to 156 kHz for the accelerometer design of Table 7. The acceptable range for the normal sense signal is 20% from the nominal value (105 mV), which implies a range of 84 mV to 126 mV. If the bandwidth of the processed sense signal is restricted to about 500 Hz then a reasonably low noise voltage floor of about 2 µV can be achieved.

TABLE 7

| | | | Self-test finger outputs | | | | Self-test beam outputs | | | |
|---|---|---|---|---|---|---|---|---|---|---|
| Defect location (%) | $f_x$ (kHz) | Normal sense output (mv) | $V_l^f$ (mV) | $V_r^f$ (mV) | $V_l^f - V_r^f$ (µV) | $1 - \frac{V_l^f}{V_r^f}$ (%) | $V_l^b$ (mV) | $V_r^b$ (mV) | $V_l^b - V_r^b$ (µV) | $1 - \frac{V_l^b}{V_r^b}$ (%) |
| None | 12.53 | 10.52 | 5.256 | 5.259 | −3 | 0 | 1.851 | 1.853 | −2 | 0 |
| 10 | 13.12 | 9.58 | 4.785 | 4.788 | −3 | 0 | 1.643 | 1.670 | −27 | 1.6 |
| 20 | 14.00 | 8.40 | 4.195 | 4.197 | −2 | 0 | 1.338 | 1.411 | −73 | 5.2 |
| 30 | 15.32 | 6.98 | 3.490 | 3.492 | −2 | 0 | 1.016 | 1.149 | −133 | 11.5 |

TABLE 8

| | | | Self-test finger outputs | | | | Self-test beam outputs | | | |
|---|---|---|---|---|---|---|---|---|---|---|
| Defect location (%) | $f_x$ (kHz) | Normal sense output (mv) | $V_l^f$ (mV) | $V_r^f$ (mV) | $V_l^f - V_r^f$ (µV) | $1 - \frac{V_l^f}{V_r^f}$ (%) | $V_l^b$ (mV) | $V_r^b$ (mV) | $V_l^b - V_r^b$ (µV) | $1 - \frac{V_l^b}{V_r^b}$ (%) |
| None | 12.53 | 10.52 | 5.256 | 5.259 | −3 | 0 | 1.851 | 1.853 | −2 | 0 |
| 0 | 13.74 | 8.30 | 4.544 | 3.761 | 783 | 20.8 | 1.539 | 1.541 | −2 | 0 |
| 10 | 14.09 | 7.85 | 4.347 | 3.499 | 848 | 24.2 | 1.465 | 1.466 | −1 | 0 |
| 20 | 14.57 | 7.27 | 4.089 | 3.183 | 906 | 28.5 | 1.370 | 1.371 | −1 | 0 |

TABLE 9

| | | | Self-test finger outputs | | | | Self-test beam outputs | | | |
|---|---|---|---|---|---|---|---|---|---|---|
| $\delta H_{right}$ (µm) | $f_x$ (kHz) | Normal sense output (mv) | $V_l^f$ (mV) | $V_r^f$ (mV) | $V_l^f - V_r^f$ (µV) | $1 - \frac{V_l^f}{V_r^f}$ (%) | $V_l^b$ (mV) | $V_r^b$ (mV) | $V_l^b - V_r^b$ (µV) | $1 - \frac{V_l^b}{V_r^b}$ (%) |
| 0 | 12.53 | 10.52 | 5.256 | 5.259 | −3 | 0 | 1.851 | 1.853 | −2 | 0 |
| +0.5 | 12.51 | 10.44 | 5.248 | 5.193 | 55 | −1.0 | 1.841 | 1.836 | 5 | −0.3 |
| +1.0 | 12.51 | 10.23 | 5.224 | 5.001 | 223 | −4.4 | 1.810 | 1.789 | 21 | −1.2 |
| +1.5 | 12.51 | 9.87 | 5.177 | 4.695 | 482 | −10.2 | 1.760 | 1.712 | 48 | −2.8 |
| +2.0 | 12.51 | 9.42 | 5.115 | 4.309 | 806 | −18.7 | 1.696 | 1.616 | 80 | −4.9 |

In the disclosed BIST approach to the accelerometer, self-test outputs are produced from normal sense fingers and spring beams. Depending on the particular nature of an asymmetry, one output may be more suited than the other at observing the effects of a defect. Also, the asymmetries detected at one output need not be a subset of those detected at the other. Hence, the use of self-test outputs from both beams and fingers, and possibly other sites, is necessary to minimize defective parts from being shipped as good parts.

In the following subsections, the symbols $V_{bl}$ and $V_{br}$ are used to refer to the self-test outputs sampled from the spring beams $B_1$ and $B_2$ (see FIG. 2), respectively. Similarly, $V_{fl}$ and $V_{fr}$ represent self-test outputs sampled from the regular sense finger pairs [[$M_5M_7$] and [$M_6M_8$] (see FIG. 2), respectively. The voltage difference between each pair of self-test signals must be more than the 2 μV noise floor to be considered significant.

Beam Bridges

A bridge defect can be caused by particulate matter that attaches a movable beam to an adjacent structure (e.g, a dummy finger) thereby hindering its motion. Due to the four-fold symmetry of the accelerometer, simulation of a bridge defect has been limited to one quadrant of the layout. Specifically, beam $B_1$ of the upper left quadrant of FIG. 2 is used. Column 1 of Table 7 indicates the defect location expressed as a percentage of beam length. The 0% point is the anchored end of the beam and the 100% point is where the beam meets the shuttle. Columns 2 and 3 list the values of resonant frequency and normal sense output, respectively, for bridge defects located at different locations along the beam.

As the defect location moves from the anchor end of the beam to the end where it is attached to the shuttle, the beam stiffness increases. Consequently, shuttle displacement decreases. Also the layout asymmetry becomes more pronounced resulting in an increased difference between the two beam sense outputs $V_{bl}$ and $V_{br}$.

The listed resonant frequency values shown in Table 7 are all within the acceptable range, indicating these defects will pass a resonant frequency test. The normal sense output is outside its acceptable range only for the 30% point. Hence, in a majority of cases, a test based on resonant frequency and normal sense output will be ineffective. The finger sense outputs $V_{fl}$ and $V_{fr}$ hardly diverge because of the stiffness of the shuttle which means virtually equal displacements on both sides. However, the beam self-test outputs $V_{bl}$ and $V_{br}$ do indicate the presence of an asymmetry.

Finger Bridges

A finger bridge defect is similar to a beam bridge defect except that it is located between a movable finger and a fixed finger. Naturally, it acts as a hindrance to shuttle motion. In this analysis the material of the bridging defect has been assumed to be dielectric because such defects are harder to detect. As before, the symmetry of the accelerometer is used to limit simulations to the upper right quadrant of the layout. An inter-finger defect that bridges fingers $M_6$ and $S_3$ in the upper right quadrant of FIG. 2 is considered. An inter-finger bridge defect is modeled using the approach in N. Deb and R. D. Blanton, "High-Level Fault Modeling in Surface-Micromachined MEMS," *Proc. of Design, Test, Integration, and Packaging of MEMS/MOEMS*, pp. 228-235 (May 2000). Defect location is expressed as a percentage of movable finger length. The 0% point is the movable finger tip, and the 100% point is the movable finger base where it meets the shuttle.

The results in Table 8 indicate that a finger bridge defect may pass a resonant frequency test but will fail a sensitivity test. However, the normal sense output by itself does not indicate an asymmetry. The beam self-test outputs $V_{bl}$ and $V_{br}$ hardly diverge and hence are ineffective. However, the finger self-test outputs $V_{fl}$ and $V_{fr}$ diverge significantly and clearly indicate the presence of asymmetry.

Finger Height Mismatch

Ideally, the fingers should all be at the same height above the die surface. But variations in parameters such as temperature and residual stress lead to finger height mismatch. Height mismatch between the fixed and movable fingers reduces inter-finger overlap and hence inter-finger capacitance. Here it is shown how left-right asymmetry caused by such height mismatch can be detected by this BIST approach. Without loss of generality, the finger height mismatch is assumed to exist on the right side of the accelerometer only ($\delta H_{left}$.0). Table 9 lists the simulation results. Column 1 lists the relative height mismatch which is expressed as $\delta H_{right}$ $\delta H_{left}$ $\delta H_{right}$. Results for negative values of mismatch have not been separately simulated since they would yield similar results. Such symmetrical behavior is exhibited by CMOS-MEMS because the gap between the substrate and the accelerometer fingers is 20 μm.

With increasing height mismatch, the difference in sensing between the two sides increases, as evident from both [$V_{bl}V_{br}$] and [$V_{fl}V_{fr}$]. The resonant frequency remains virtually unchanged clearly indicating a resonant frequency test will not detect this form of asymmetry. The normal sense output reveals an acceptable reduced voltage due to the reduced sense capacitance. Hence, a test based on resonant frequency and normal sense output will be ineffective in detecting the asymmetry. However, the difference between the finger self-test outputs $V_{fl}$ and $V_{fr}$ clearly indicate the presence of asymmetry. Although not as sensitive, the beam self-test outputs $V_{bl}$ and $V_{br}$ also vary with the amount of mismatch and therefore indicate an asymmetry as well.

Local Etch Variations

TABLE 10

| Etch variation (μm) | $f_x$ (kHz) | Normal sense output (mv) | Self-test finger outputs | | | | Self-test beam outputs | | | |
|---|---|---|---|---|---|---|---|---|---|---|
| | | | $V_l^f$ (mV) | $V_r^f$ (mV) | $V_l^f - V_r^f$ (μV) | $1 - \frac{V_l^f}{V_r^f}$ (%) | $V_l^b$ (mV) | $V_r^b$ (mV) | $V_l^b - V_r^b$ (μV) | $1 - \frac{V_l^b}{V_r^b}$ (%) |
| +0.025 | 12.33 | 10.30 | 5.404 | 4.897 | 507 | −10.3 | 1.837 | 1.789 | 48 | −2.7 |
| +0.020 | 12.37 | 10.34 | 5.375 | 4.967 | 408 | −8.2 | 1.840 | 1.801 | 39 | −2.2 |
| +0.010 | 12.45 | 10.43 | 5.315 | 5.110 | 205 | −4.0 | 1.845 | 1.826 | 19 | −1.0 |
| 0 | 12.53 | 10.52 | 5.256 | 5.259 | −3 | 0 | 1.851 | 1.853 | −2 | 0 |
| −0.010 | 12.61 | 10.61 | 5.197 | 5.414 | −217 | 4.0 | 1.858 | 1.881 | −23 | 1.2 |
| −0.020 | 12.69 | 10.71 | 5.136 | 5.574 | −438 | 7.9 | 1.865 | 1.910 | −45 | 2.3 |
| −0.025 | 12.73 | 10.76 | 5.105 | 5.656 | −551 | 9.7 | 1.869 | 1.925 | −56 | 2.9 |

TABLE 11

| Parasitic mismatch (%) | $f_x$ (kHz) | Normal sense output (mv) | Self-test finger outputs | | | | Self-test beam outputs | | | |
|---|---|---|---|---|---|---|---|---|---|---|
| | | | $V_l^f$ (mV) | $V_r^f$ (mV) | $V_l^f - V_r^f$ (μV) | $1 - \frac{V_l^f}{V_r^f}$ (%) | $V_l^b$ (mV) | $V_r^b$ (mV) | $V_l^b - V_r^b$ (μV) | $1 - \frac{V_l^b}{V_r^b}$ (%) |
| 0 | 12.53 | 10.52 | 5.256 | 5.259 | −3 | −0 | 1.851 | 1.853 | −2 | 0 |
| 1.25 | 12.51 | 10.50 | 5.239 | 5.265 | −26 | 0.5 | 1.843 | 1.850 | −7 | 0.4 |
| 2.5 | 12.51 | 10.49 | 5.221 | 5.270 | −49 | 0.9 | 1.836 | 1.847 | −11 | 0.6 |
| 3.75 | 12.51 | 10.48 | 5.203 | 5.274 | −71 | 1.3 | 1.828 | 1.845 | −17 | 0.9 |
| 5.0 | 12.51 | 10.47 | 5.186 | 5.280 | −94 | 1.8 | 1.819 | 1.841 | −22 | 1.2 |

An etching process is used in fabrication to remove sacrificial material to free the micromechanical sensor. Material removal through an etching process varies with time and space even though such variation is not desirable. For example, a rectangular structure designed to have length l and width w may be subjected to more than the intended etch by a length δ, resulting in dimensions [1−2 δ,w−2 δ]. This is due to the fact that each side-wall of the rectangular structure shifts inwards by δ so that each dimension reduces by 2 δ. This type of etch variation is called over-etch. In a similar fashion, under-etch causes an oversize structure of size [l+2 δ, w+2 δ].

Etch variation can also be local in nature. Consider two rectangular structures that are designed to be identical but during fabrication they are subjected to different etch variations, $\delta_1$ and $\delta_2$. As a result, the two structures will have different dimensions, causing a left-right asymmetry.

Without loss of generality, we assumed in simulation that the accelerometer's left side has nominal etch while the right side has either over- or under-etch. Table 10 gives the simulation results. Column 1 lists the relative etch mismatch. The mismatch in etch variation is positive when the right side is more etched than the left side. As the relative over-etch increases, the sensitivity of the right side reduces because of the loss in the inter-finger capacitance. Consequently, the differences $|V_{fl}-V_{fr}|$ and $|V_{bl}-V_{br}|$ increase. For increasing levels of relative under-etch, two counteracting effects become significant. The increased beam thickness on the right side causes increased stiffness which in turn reduces displacement. However, the reduced inter-finger gap causes higher inter-finger capacitance which more than offsets the loss of sensitivity. In any case, a higher level of local etch variation leads to a greater difference between each pair of self-test outputs.

A test based on resonant frequency test and normal sense output will not detect the presence of this type of asymmetry because both parameters are within their respective acceptable ranges. The finger self-test outputs $V_{fl}$ and $V_{fr}$ diverge and hence indicate an asymmetry. The beam self-test outputs $V_{bl}$ and $V_{br}$ indicate an asymmetry as well. As in the case of finger height mismatch, $|V_{fl}-V_{fr}|>10|V_{bl}-V_{br}|$, which means the finger self-test outputs are stronger indicators of this type of asymmetry as compared to the beam self-test outputs.

Parasitic Variation

Ideally, the sensing circuitry for self-test should only be sensitive to asymmetries in the micromechanical sensor and not the external electronics (including interconnects). In reality, a difference signal may be due to variation external to the sensor area, such as in the interconnects which carry the self-test sense signals to the inputs of the differential amplifier. With reference to the differential amplifier in FIG. 4, assume the interconnect capacitances ($C_{p1}$ and $C_{p2}$) are unequal. The objective is to determine the extent to which the parasitic capacitance mismatch due to such interconnect asymmetry will produce a significant sense amplifier output. The maximum value of the parasitic mismatch can be used to decide a suitable threshold for detection of sensor asymmetry during self-test. The nominal interconnect capacitance is assumed to be 40 fF. A maximum mismatch of 5% between the two interconnects is considered, assuming that a good layout design and a stable process can restrict such variations to the presumed limit. Without loss of generality, we assumed that the interconnect from the left sense points (for both the finger and beam outputs) are larger than the right. The simulation results are listed in Table 11.

The parasitic mismatch has a more pronounced effect for the beam self-test outputs $[V_{bl} V_{br}]$ as compared to the finger self-test outputs $[V_{fl} V_{fr}]$ because the beam self-test signals are much weaker. It is observed that $V_{fl} V_{fr}$ is less sensitive to variations in the interconnect when compared to variation in local etch and finger height. However, the same is not true for the beam self-test outputs. Interconnect capacitance mismatch does indeed cause self-test outputs to exceed the noise floor. However, in a majority of the cases considered, the output magnitude does not rival that produced by the other defects. This implies that variations of up to 5% in the interconnect capacitance are unlikely to falsely indicate asymmetry in the micromechanical structure of the accelerometer. Only a beam bridge defect that is located close to its anchor point will produce a beam self-test output difference that is not significantly larger than that produced by interconnect mismatch.

BIST Implementation

Figure 8:
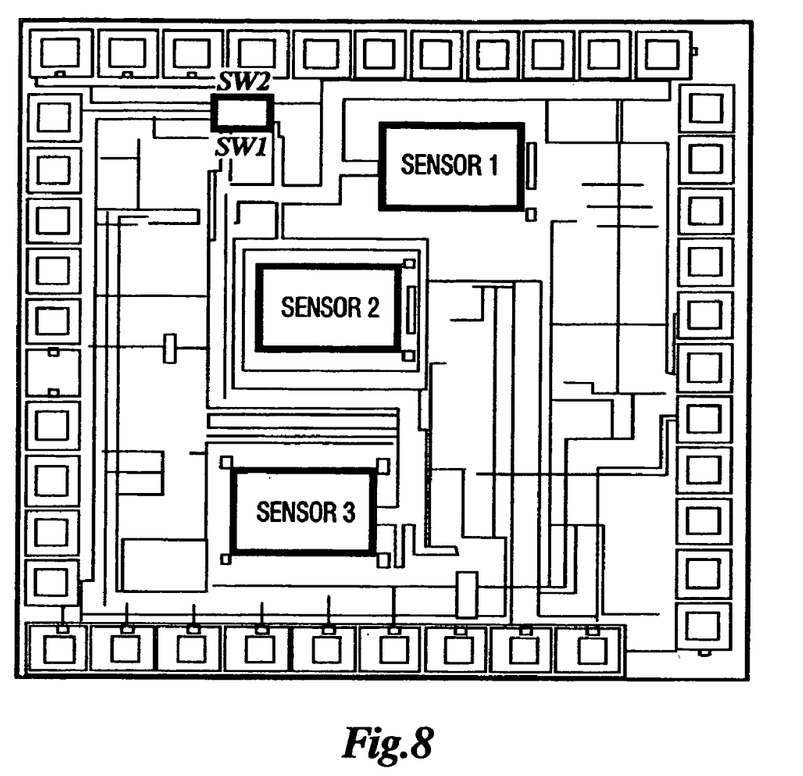
FIG. 8 illustrates the layout of the BIST design showing the location of the sensors and the switch-based BIST control.

Because simulation alone is not sufficient for validating the differential BIST approach disclosed here, a prototype was designed and fabricated in which a subset of the BIST features was added to the accelerometer design of Wu et al., "A Low-Noise Low-Offset Chopper-Stabilized Capacitive-readout Amplifier for CMOS MEMS Accelerometers," supra. The BIST implementation was limited to finger self-test for the purpose of validation. The layout of the prototype design is shown in FIG. 8. The technology used is a three-metal-one-poly, 06 μm CMOS process.

Figure 9:
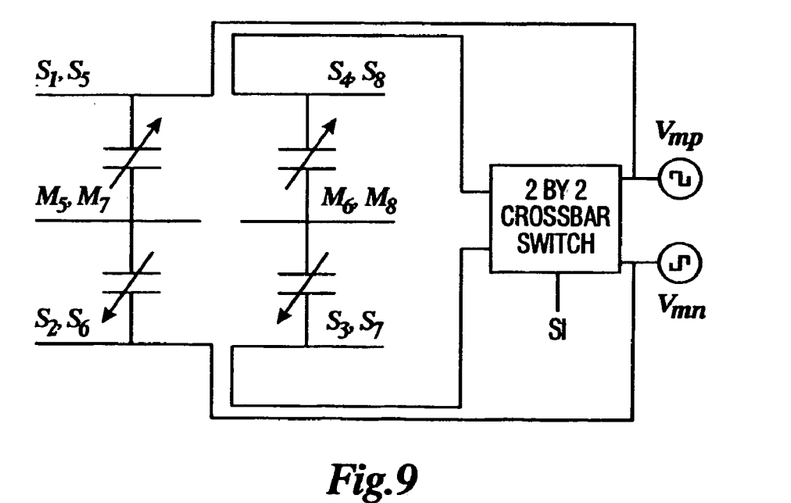
FIG. 9 is a schematic illustrating one example of control circuitry for use with BIST.

The control circuitry for BIST is illustrated in FIG. 9. The two phases of the modulation voltage signal are $V_{mp}$ and $V_{mn}$. The digital self-test input pin (SI) is driven to a logic zero during normal operation. For SI=0, the capacitive network reduces to the one shown in FIG. 5A. Self-test is activated when SI=1. For this case, the capacitive network reduces to the one shown in FIG. 5B. The overhead of the BIST circuit includes routing area for two extra wires for the modulation signals and area for simple 2-by-2 cross-bar switch. The area of the switch is 105 μm by 35 μm, which is 0.06% of the of the total die area (25 mm by 25 mm). The routing for the two extra modulation lines in the sensor was achieved by using the POLY1 layer. An extra input pin is required for activating the self-test. However, no extra pin is required for the self-test output because the same pin is used for normal and BIST operation.

The die size available to us allowed us to implement three identical micromechanical sensors. The same self-test control circuitry, consisting of two switches (SW1 and SW2 in FIG. 9), was used to control all three sensors simultaneously. In other words, the self-test mode is activated for all the sensors in parallel. Because the same output pin is shared by the sense signals from the three sensors, another switch-based control block is used to ensure that only one sense signal is transferred to the output pin at any given time. The control block uses high-impedance circuitry to, isolate the remaining two sensor output signals.

The differential self-test method described in this disclosure is focused on enhancing observation and therefore complements the existing built-in stimulus generation techniques found in industry and proposed in the literature. We have demonstrated the ability to detect the presence of various defect types that cause local asymmetry, which are not detectable by typical specification based tests that measure both resonant frequency and sensitivity. The self-test method described herein can substantially enhance detection of hard-to-detect defects. The tradeoff of such an approach is a modest increase in design complexity and device area for additional electronics.

While the present disclosure has been described in connection with various embodiments, those of ordinary skill in the art will recognize that various modifications and variations are possible. This disclosure and the following claims are intended to cover all such modifications and variations.

What is claimed is:

1. A method, comprising:
   actuating a MEMS device; and
   comparing outputs from a first and a second sensor electrically isolated from one another and positioned to produce signals of substantially identical characteristics so as to identify asymmetries in said MEMS device.

2. The method of claim 1 wherein said actuating is performed mechanically.

3. The method of claim 1 wherein said actuating is performed electrically.

4. The method of claim 3 wherein said electrically actuating comprises interchanging a polarity of a modulation signal applied between pairs of fixed and movable members.

5. The method of claim 1 wherein said comparing is performed in real time.

6. The method of claim 1 wherein said comparing reveals local asymmetry.

7. The method of claim 6 wherein said local asymmetry includes one of a particle bridge, vertical misalignment, variation in local etch and unequal parasitics in the interconnects between the sensors and a circuit for analyzing.

8. A method, comprising:
   actuating a MEMS device; and
   comparing outputs from a first and a second symmetrically located sensor in real time so as to identify asymmetries in said MEMS device.

9. The method of claim 8 wherein said actuating is performed mechanically.

10. The method of claim 8 wherein said actuating is performed electrically.

11. The method of claim 10 wherein said electrically actuating comprises interchanging a polarity of a modulation signal applied between pairs of fixed and movable members.

12. The method of claim 8 wherein said comparing reveals local asymmetry.

13. The method of claim 12 wherein said local asymmetry includes one of a particle bridge, vertical misalignment, variation in local etch and unequal parasitics in the interconnects between the sensors and a circuit for analyzing.

* * * * *

UNITED STATES PATENT AND TRADEMARK OFFICE
CERTIFICATE OF CORRECTION

PATENT NO. : 7,340,956 B2
APPLICATION NO. : 11/370818
DATED : March 11, 2008
INVENTOR(S) : Nilmoni Deb and Ronald DeShawn Blanton It is certified that error appears in the above-identified patent and that said Letters Patent is hereby corrected as shown below:

Title page Page 2, Column 1, Item (56) 8th Reference, Line 3, after "Sensors and" insert --Actuators, pp. 1461-1464, June 1997--.

Title page Page 2, Column 2, Item (56) 4th Reference, Line 3, delete "Ctuators A" and substitute therefore --Actuators, A21-A23,--.

Title page Page 2, Column 2, Item (56) 7th Reference, Line 3, after "Solid State" insert --Circuits Conference--.

Title page Page 2, Column 2, Item (56) 9th Reference, Line 3, after "Simulation of" insert --Microsystems--.

Title page Page 2, Column 2, Item (56) 10th Reference, Line 3, after "Micro Electro" insert --Mechanical Systems (MEMS)--.

Column 20, Line 64, delete "40 fF" and substitute therefore --40 $fF$--.

Column 21, Line 46, delete "of the of the" and substitute therefore --of the--.

Column 21, Line 63, delete "to, isolate" and substitute therefore --to isolate--.

Signed and Sealed this

Sixteenth Day of March, 2010

David J. Kappos
*Director of the United States Patent and Trademark Office*